United States Patent
Götzenberger

(10) Patent No.: US 7,002,385 B2
(45) Date of Patent: Feb. 21, 2006

(54) CIRCUIT ARRANGEMENT AND METHOD FOR PRODUCING A PULSE WIDTH MODULATED SIGNAL

(75) Inventor: Martin Götzenberger, Ingolstadt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/753,508

(22) Filed: Jan. 8, 2004

(65) Prior Publication Data

US 2004/0160252 A1     Aug. 19, 2004

(30) Foreign Application Priority Data

Jan. 16, 2003   (DE) ............................. 103 01 501

(51) Int. Cl.
    *H03K 3/07*   (2006.01)
(52) U.S. Cl. ....................... 327/175; 327/172
(58) Field of Classification Search ............... 327/130, 327/172–176
See application file for complete search history.

(56) References Cited

U.S. PATENT DOCUMENTS

| 4,293,817 A | * | 10/1981 | DeMichele | ................. 327/172 |
| 4,607,321 A | | 8/1986 | Obi | .............................. 363/41 |
| 4,639,844 A | | 1/1987 | Gallios et al. | ................ 363/17 |
| 4,988,958 A | | 1/1991 | Tsuruoka et al. | ........... 331/111 |
| 5,739,711 A | * | 4/1998 | Mandelcorn | ................ 327/175 |
| 6,064,248 A | * | 5/2000 | Seki | ........................... 327/296 |
| 6,636,124 B1 | | 10/2003 | Liu | ............................. 332/109 |

FOREIGN PATENT DOCUMENTS

| CH | 493 168 | 7/1968 |
| DE | 101 35 810 A1 | 2/2003 |
| JP | 04 331472 | 11/1992 |

\* cited by examiner

*Primary Examiner*—Timothy P. Callahan
*Assistant Examiner*—An T. Luu
(74) *Attorney, Agent, or Firm*—Baker Botts L.L.P.

(57) ABSTRACT

A circuit arrangement for producing a PWM signal (x) having a prescribed PWM frequency from two signals (a, b) which are input into the circuit arrangement, where the PWM signal (x) has a duty ratio which varies with the difference between the signals (a, b) comprises a signal generator (16) for producing a cyclic comparison signal, particularly an essentially trapezoidal signal (d), whose frequency is the same as the PWM frequency and whose shape is dependent on one (a) of the two signals (a, b), and a comparator (18) for comparing the other (b) of the two signals (a, b) with the comparison signal (d) and for providing the PWM signal (x) at the output of the comparator.

14 Claims, 3 Drawing Sheets

US 7,002,385 B2

CIRCUIT ARRANGEMENT AND METHOD FOR PRODUCING A PULSE WIDTH MODULATED SIGNAL

PRIORITY

This application claims foreign priority of the German application DE 10301501.9 filed on Jan. 16, 2003.

TECHNICAL FIELD OF THE INVENTION

The present invention relates to a circuit arrangement and also a method for producing a PWM (pulse width modulation) signal particularly for use when forming an actuating signal for a control loop.

DESCRIPTION OF THE RELATED ART

When controlling a variable (controlled variable), such as the output current from a DC/DC converter, the control error, that is to say the difference between a nominal value (reference variable) and an actual value, is input into a controller which provides a manipulated variable in line with a control characteristic. This manipulated variable then acts directly or indirectly via an actuating device on the path which is to be controlled. In the example of the DC/DC converter, the manipulated variable is usually used for driving a transistor half-bridge (converter power section).

In many instances of application, the nominal values and actual values input into the controller and also the manipulated variable which is output by the controller are represented by analog signals. In these applications, however, the manipulated variable is in turn often needed in the form of a PWM signal for driving the controlled path or an upstream actuating device. In these instances, a PWM modulator is then usually provided, which is in the form of part of the controller or is subordinate to the controller.

Such control will be illustrated in FIG. 1 using the example of a DC/DC converter. The DC/DC converter 1 comprises a clock generator 2 for clocking a sawtooth oscillator 3 which delivers a cyclic sawtooth waveform signal c (cf. FIG. 2) to a first input on a comparator 4. A nominal value output unit 5 outputs an analog nominal value signal a, corresponding to the nominal value of the output current, to a summation point 6, to which there is also supplied an actual value signal b corresponding to the actual value (actual current value). This actual value signal b is obtained by measuring the current at the output of a converter power section 7.

At the summation point 6, as shown, a signed sum comprising actual value b and nominal value a is formed and is delivered to a second input on the comparator 4 in the form of an analog signal corresponding to this sum. Since the latter signal is proportional to the control error, the summation point provides a "P controller".

As a departure from the exemplary embodiment shown, it would be possible, by way of example, for a further control element to be interposed between the summation point 6 and the second input of the comparator 4, said further control element being able to be used to set the control characteristic as desired, for example in order to provide a PI controller or a PID controller.

As described below, the output of the comparator 4 provides a PWM modulated manipulated variable signal x which represents the manipulated variable and is suitable for driving the power section 7. The comparator 4 thus forms, together with the clock generator 2 and the sawtooth oscillator 3, a "PWM modulator" for converting the analog signal coming from the summation point (generally, controller) into a PWM signal, that is to say a cyclic pulsed signal whose duty ratio represents (codes) the manipulated variable.

If, in the case of the DC/DC converter shown in FIG. 1, the nominal value is produced by a digital control device (e.g. microcontroller), then providing the nominal value signal a in analog form means a relatively high level of complexity.

FIG. 2 illustrates a time profile for the signals a, b and c by way of example. It will be assumed that the nominal value a can vary in a range from $a_{min}$ to $a_{max}$ and, in the period of time under consideration, has a constant value of zero. If, as shown, the actual value signal b now likewise has the value zero, that is to say the actual value is the same as the nominal value, then the comparison performed by the comparator 4 between the two analog input signals a, b delivers the signal x shown in FIG. 3. In the case of the exemplary embodiment shown, the signals a, b, c and x are represented by voltages (U).

The (manipulated variable) signal x is the PWM drive signal required for driving the converter power section 7. It has a period T in line with the frequency prescribed by the clock generator 2 and, in every period T, has an "on-time component" T1 and an "off-time component" T2. The magnitude of these time components T1, T2 is determined by the "duty ratio" T1/T of the PWM signal x, which in turn also determines the converter output current produced by the power section 7 to a large extent. To this end, the power section 7 is designed as a step down controller with switching transistors which are driven by the PWM actuating signal x and produce the converter output voltage across an output capacitor via an inductor, for example in a manner which is known per se. With such a design, the output current obtained for a particular actuating signal x is also dependent on the converter output voltage. This output voltage changes, for example in the event of suddenly occurring load changes, such as are caused by loads connected to the converter turning on and off.

Coming back to FIG. 2, consideration will now be given to the case in which the actual value signal b differs from the nominal value signal a, which continues to be assumed to have the value zero, denoted by b' in the figure. In this case, the result is the PWM manipulated variable signal x' shown in FIG. 4, which has the same period T but an altered duty ratio T1'/T which acts on the nominal value a during the current regulation for the purpose of aligning the actual value b'.

In summary, the circuit arrangement formed from the components 2, 3, 4 and 6 is thus used to produce a PWM signal x having a prescribed PWM frequency from two input analog signals a and b by first forming a difference between the signals a and b and comparing the result of this difference formation with a sawtooth waveform signal.

A drawback of this is the complexity for producing the required difference formation and also an analog nominal value signal.

SUMMARY OF THE INVENTION

Accordingly, it is an object of the present invention to specify a circuit arrangement and also a method which can easily be used to produce a PWM signal, particularly for use as a manipulated variable signal within the context of a controller.

This object can be achieved by a circuit arrangement control loop comprising a circuit arrangement for producing a PWM signal having a prescribed PWM frequency from two signals which are input into the circuit arrangement, where the PWM signal has a duty ratio which varies with the difference between the signals, particularly which varies essentially linearly with the difference, comprising a signal generator for producing a cyclic comparison signal, particularly an essentially trapezoidal signal, whose frequency is the same as the PWM frequency and whose shape is dependent on one of the two signals, and a comparator for comparing the other of the two signals with the comparison signal and for providing the PWM signal at the output of the comparator.

The object can also be achieved by a control loop comprising a circuit arrangement comprising a prescribed PWM frequency from two signals which are input into the circuit arrangement, where the PWM signal has a duty ratio which varies with the difference between the signals, particularly which varies essentially linearly with the difference, a signal generator for producing a cyclic comparison signal, particularly an essentially trapezoidal signal, whose frequency is the same as the PWM frequency and whose shape is dependent on one of the two signals, and a comparator for comparing the other of the two signals with the comparison signal and for providing the PWM signal at the output of the comparator, wherein the PWM signal produced by the circuit arrangement is a manipulated variable from a control loop, which is formed from the signals used as the control loop's reference variable and controlled variable.

The signal generator may produce the comparison signal with an amplitude which is independent of one signal, particularly with a constant amplitude. The signal generator may produce the comparison signal with an edge gradient which is independent of one signal, particularly with a constant edge gradient, and the ratio of the maximum signal duration to the minimum signal duration varies as a function of one signal. The signal generator can be formed from a square wave signal generator with a downstream RC filter.

The object can also be achieved by a method for producing a PWM signal having a prescribed PWM frequency from two signals, where the PWM signal has a duty ratio which varies with the difference between the signals, particularly which varies essentially linearly with the difference, comprising the steps of:

producing a cyclic comparison signal, particularly an essentially trapezoidal signal, whose frequency is the same as the PWM frequency and whose shape is dependent on one of the two signals, and comparing the other of the two signals with the comparison signal in order to provide the PWM signal as the result of the comparison.

The object may further be achieved by a method for producing a manipulated variable from a control loop from the signals used as the control loop's reference variable and controlled variable, comprising the step of:

producing a PWM signal having a prescribed PWM frequency from two signals, where the PWM signal has a duty ratio which varies with the difference between the signals, particularly which varies essentially linearly with the difference, by producing a cyclic comparison signal, particularly an essentially trapezoidal signal, whose frequency is the same as the PWM frequency and whose shape is dependent on one of the two signals, and comparing the other of the two signals with the comparison signal in order to provide the PWM signal as the result of the comparison.

The methods may further comprise the step of producing the comparison signal with an amplitude which is independent of one signal, particularly with a constant amplitude. The methods may also comprise the step of producing the comparison signal with an edge gradient which is independent of one signal, particularly with a constant edge gradient, and the ratio of the maximum signal duration to the minimum signal duration varies as a function of one signal.

Thus, the inventive circuit arrangement may comprise:

a signal generator for producing a cyclic comparison signal, particularly an essentially trapezoidal signal, whose frequency is the same as the PWM frequency and whose shape is dependent on one of the two signals, and a comparator for comparing the other of the two signals with the comparison signal and for providing the PWM signal at the output of the comparator.

The inventive embodiment dispenses with forming a difference between the two input signals. Instead, one of the two signals is compared with a comparison signal whose shape is dependent on the other of the two signals. Although this procedure generally increases the complexity for producing the cyclic comparison signal, since there is a need for the signal shape to be dependent on one of the variables in this case, the simplification of circuitry as a result of dispensing with the difference formation between the two signals is overwhelming in practice. In addition, it is not imperative for one signal to be provided in the form of an analog signal in the case of the inventive embodiment. Instead, the signal generator can be driven, by way of example, by a digital signal which represents the nominal value.

The term "essentially trapezoidal signal", subsequently also referred to as "trapezial signal" for short, represents, within the meaning of the invention, a cyclic signal having signal maxima and signal minima whose extent makes up at least 10% of the period in total, with the signal value varying only slightly (less than 5%) or not at all within a respective extent, and with the signal maxima and signal minima being connected to one another by continuously running edges which have an essentially linear profile at least in their central region. In particular, there can be a comparison signal, in which every maxima and minima extent is always at least 5% of the period.

Producing the comparison signal is particularly simple if the signal generator produces this signal with a constant amplitude and/or produces it with a constant edge gradient and the ratio of the maximum signal duration (extent) to the minimum signal duration varies as a function of one of the two signals.

In one particularly preferred embodiment, the edges of the comparison signal are represented by portions of a charging curve or discharging curve for a capacitor which is charged and discharged cyclically with the prescribed PWM period. This can be realized particularly easily if the signal generator is formed from a square wave signal generator with downstream RC filter. In this context, the RC time constant is preferably smaller than 10% of the period duration.

The inventive circuit arrangement can be used, in particular, to construct a control loop which has simplified circuitry and in which the PWM signal produced by the comparator is a manipulated variable from the control loop, for example for driving a power section (as described above) of a DC/DC converter.

In this way, it is a very simple matter to produce pure P controllers in particular (prescribed edge gradient of the comparison signal). Smaller frequency response corrections for influencing the transient response are also possible.

Advantageously, the actual value source (measuring device) is loaded only slightly, which means that the actual value can be tapped off across a burden resistor, for example directly without buffering, during current regulation.

In one embodiment, the original square wave signal (or else the comparison signal or the trapezial signal itself) can be produced directly by a digital control device operated under program control, such as a microcontroller. This means that the desired dependency of the comparison signal which is to be produced can be realized under program control in the region of this control device. It is also possible for such a control device in a DC/DC converter to compensate, if desired, for the influence of (generally slow) variations in that voltage with which a converter power section is operated (supplied) ("intermediate circuit voltage").

Sometimes, e.g. if the nominal value always remains constant during regulation, a comparison signal whose shape is firmly prescribed can be used.

BRIEF DESCRIPTION OF THE DRAWINGS

The invention is described in more detail below using an exemplary embodiment with reference to the appended drawings, in which.

DETAILED DESCRIPTION OF THE PREFERRED EMBODIMENTS

Figure 5:
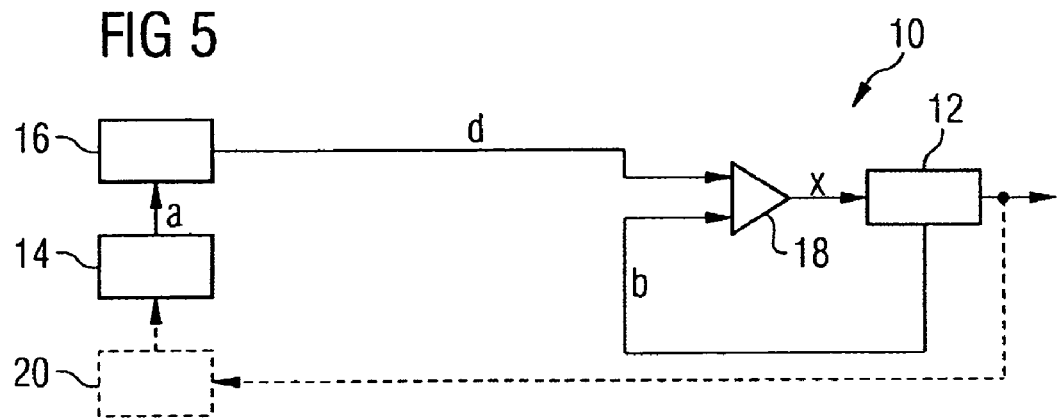
FIG. 5 shows a block diagram of a DC/DC converter designed in line with the invention.

FIG. 5 illustrates the invention using the example of a DC/DC converter 10 for providing a controlled output current at the output of a power section 12 of the converter 10.

The converter 10 can be used, by way of example, in a two-voltage onboard power supply for a motor vehicle in order to provide a supply current for electric loads which are to be operated at a rated voltage (e.g. 14 V) from a primary on board voltage (e.g. 42 V).

The PWM manipulated variable signal x having a prescribed PWM frequency, which signal is required for driving the converter power section 12, is produced from a (e.g. analog) nominal value signal a and an analog actual value signal b as follows: a nominal value output unit 14 outputs the nominal value signal a to a signal generator 16 which produces a cyclic, essentially trapezoidal signal d (cf. FIG. 6) whose frequency is the same as the PWM frequency (e.g. a few 100 kHz) and whose shape is dependent on the nominal value signal a prescribed by the unit 14.

A comparator 18 compares the signal d delivered by the signal generator 16 with the actual value signal b returned from the region of the power section 12, and its output provides the PWM signal used for driving the power section 12.

Figure 3:
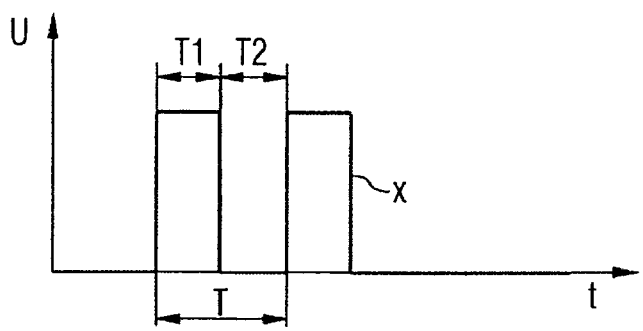
Figure 6:
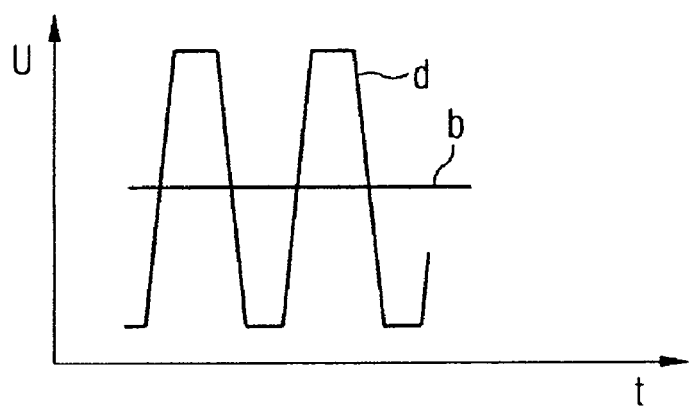
FIG. 6 and FIG. 7 show illustrations to explain the production of the PWM manipulated variable signal in the DC/DC converter shown in FIG. 5 for two different operating states.

FIG. 6 shows an example of a possible time profile for the signals d and b for a particular nominal value a. Comparison of these signals by the comparator 18 results in a PWM signal x, as shown in FIG. 3.

Figure 4:
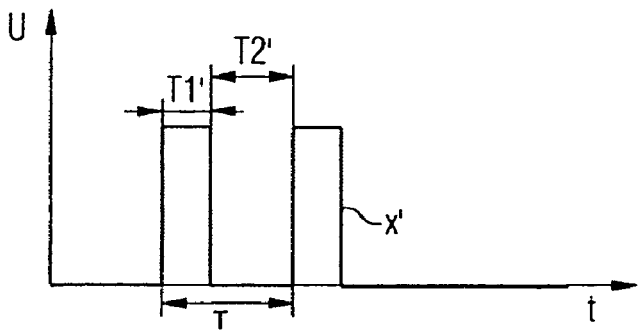
Figure 7:
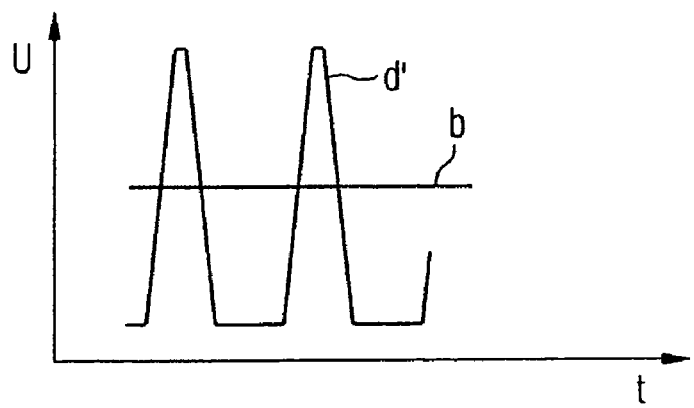

In the exemplary embodiment shown, any alteration of the nominal value a results in a shortening of the maximum durations and a corresponding lengthening of the minimum durations of the trapezial signal d, as shown in FIG. 7. If this alternative trapezial signal d' is compared with the same actual value signal b again, then the comparison result obtained is a changed PWM signal which, in the example shown, corresponds to the PWM signal x' shown in FIG. 4.

The specific way of choosing the dependency of the trapezial shape (or generally the shape of the comparison signal) on one of the input signals depends on the wanted variation in the duty ratio when the values a and b change. In the example described above, a linear variation with the difference between the signals (a−b) is desired. For implementation, provision is made for the edge gradient to be kept constant in the case of a trapezial signal but for the signal symmetry to be altered as appropriate.

Figure 1:
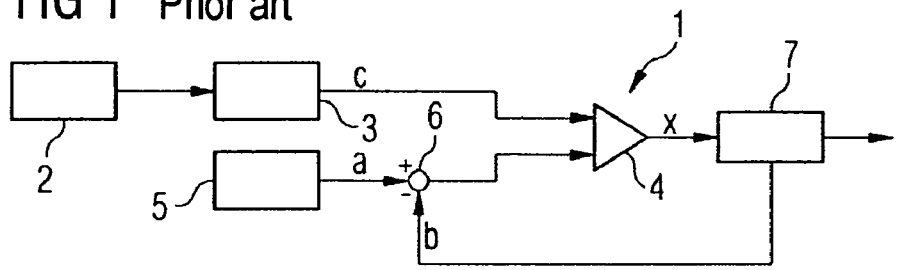
FIG. 1 shows a block diagram of a DC/DC converter which provides for regulation of the output current and in which a power section is driven with a PWM manipulated variable signal.
Figure 2:
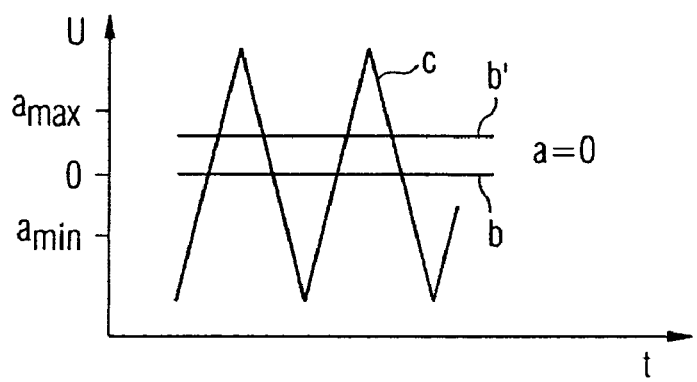
FIG. 2 shows an illustration to explain the production of the PWM signal used in the converter shown in FIG. 1, FIG. 3 and FIG. 4 show illustrations of the PWM signal produced in the converter shown in FIG. 1 for two different operating states.

It can easily be seen that the DC/DC converter 10 performs the functions of the converter described with reference to FIG. 1, but does not need to form a difference between the two analog signals a, b. It is also not imperative for the nominal value signal a to be an analog signal. Rather, any desired coding of the nominal value can be used in principle, e.g. a digital representation.

As compared with the converter form described with reference to FIG. 1, the converter 10 has a reduced number of components (omission of a difference formation stage and also of a stage for providing the analog nominal value signal). In addition, there is also a reduction in the number of those components whose values are included in drifts (e.g. manufacturing tolerances and/or temperature drifts). The circuit arrangement for producing the PWM signal x (components 16 and 18) has less complex circuitry and even tends to be more precisely specifiable.

If the actual value b exceeds a limit prescribed by the maximum voltage and the minimum voltage of the trapezial shape d, then there is a resultant abrupt change in the actuating value signal x. This results in a surprising advantage for the application of the invention for PWM manipulated variable production within the context of a controller. There is inherent limiting of the controlled variable b. For the instance of the DC/DC converter 10 shown in FIG. 5, the duty ratio of the PWM signal x and the output current from the power section 12 are thus kept within limits which are governed by the trapezial shape (amplitude). Such output current limiting is often necessary anyway for popular designs of DC/DC converter output stages (power output stage) in order to protect them against overload. This overload protection can be provided in line with the invention without additional circuit measures which would otherwise be necessary for this purpose. This reduces the number of components in this instance of application further.

FIG. 8 again shows a conventionally used sawtooth waveform signal c and, in comparison therewith, an essentially trapezoidal signal d used as a comparison signal within the context of the invention. As can be seen from the figure, the edges of the trapezial signal d have been aligned with the edges of the signal c with regard to the value range of the signal to be compared therewith (e.g. the signal b in FIG. 6), which means that, by way of example, a PWM modulator or controller operating using the signal c can have essentially the same characteristic in the relevant range.

In this example, the edges of the signal d have been formed by exponential profiles, which means that a significant deviation from the ideal trapezial shape is produced just at the ends of the edges, whereas the start of each edge practically corresponds to an ideal trapezial profile. Such a signal d can be very easily produced, by way of example, by virtue of a square wave signal generator operated at the prescribed PWM frequency being provided with a downstream RC filter, that is to say a capacitor is cyclically charged and discharged via a resistor by a square wave signal. The edge gradient is then known to depend on the RC time constant and can thus be aligned practically as desired in order to achieve a desired conversion characteristic (from the analog signal b compared therewith to the resultant PWM signal x). In the simple example of a P controller in line with FIGS. 5–7, the edge gradient of the signal d needs to be aligned with the desired P gain. In addition, the variation in the signal d with the other of the two analog signals, i.e. the dependency of the trapezial profile on this other analog signal a, needs to be aligned with the desired P gain. When the signal d is produced using a square wave signal generator with a downstream RC filter, it is possible for the square wave signal generator to have, by way of example, means for adjusting the square wave signal duty ratio or the signal symmetry as a function of the input analog signal.

FIG. 9 shows results of a simulation of a DC/DC converter which differs from the embodiment described with reference to FIG. 5 by virtue of the output current regulation shown in FIG. 5 being superposed with output current regulation for the purpose of cascaded regulation, i.e. the present output voltage is measured at the output of the power section 12 and is used for the regulated adjustment of the nominal current value. Components of such superposed voltage regulation are shown in dashes in FIG. 5 (a control element 20 evaluates the voltage measured at the output of the power section 12 and prompts adjustment for the purpose of voltage regulation of the current value a which is output by the unit 14). This superposed regulation can be carried out in practice by a digital control device operated under program control (microcontroller), for example. Particularly in this case, it is advantageous for the underlying current regulation to be provided in the form of a pure P controller with comparatively low P gain and hence for a greater or lesser control error to be permitted for the output current, since, with this proportioning of the underlying controller, an effect which stabilizes the output voltage (in the case of load changes) appears and the superposed voltage regulation can be provided comparatively slowly, which reduces the demands on the speed of the digital control device used.

Figure 8:
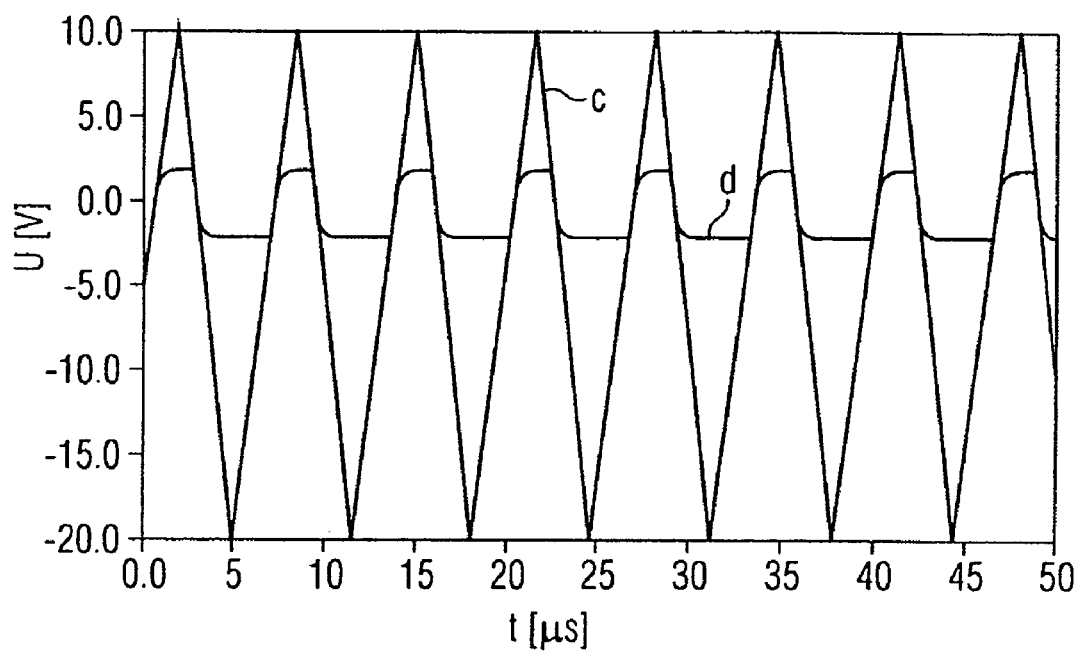
FIG. 8 shows time profiles for a sawtooth waveform signal and also for an essentially trapezoidal signal, equivalent thereto, for producing a PWM signal.
Figure 9A:
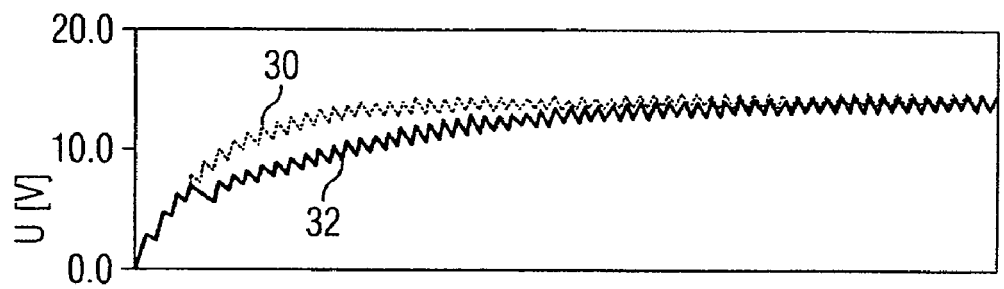
FIG. 9 shows simulation results for comparing a conventional controller with a controller designed in line with the invention.

FIG. 9a shows the simulated time profile for the converter output voltage when the converter is turned on, specifically first when using the conventional sawtooth waveform signal c from FIG. 8 for PWM manipulated variable production (curve 30) and secondly when using the essentially trapezoidal signal d from FIG. 8 (curve 32).

Figure 9B:
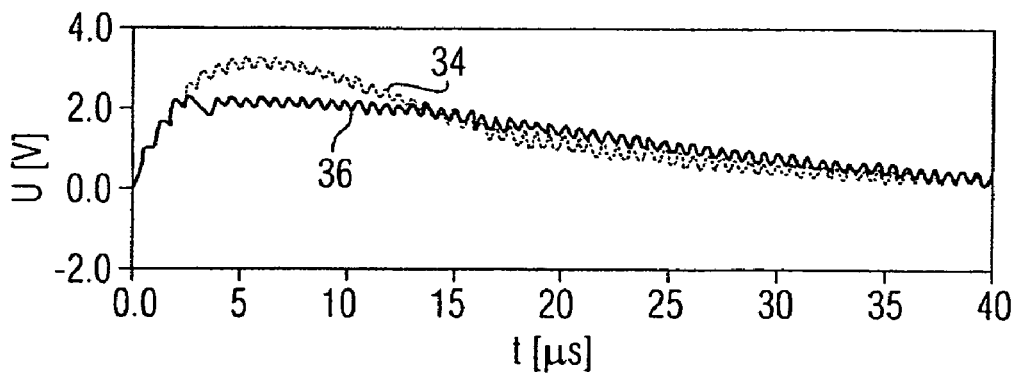

FIG. 9b shows the associated output current profiles (a voltage representing the output current) when using the sawtooth waveform signal (curve 34) and when using the trapezial signal (curve 36). The relatively high frequency variation in the curve profiles results from the clocked driving of the converter power section and the finite integration time constant of the converter power section when the PWM signal is converted into the output voltage or the output current.

It can be seen from FIG. 9 that use of the trapezial signal advantageously involves the aforementioned limiting of the output current (shallow portion of curve 36), which protects the power section from overload. By contrast, such current limiting does not arise when a sawtooth waveform signal is used (cf. curve 34), which means that the output current can assume excessively high values during the turn-on operation, as also in the case of abrupt load increases occurring during operation, besides.

I claim:

1. A circuit arrangement for producing a PWM signal having a prescribed PWM frequency from first and second signals input into the circuit arrangement, the PWM signal having a duty ratio varying essentially linearly with a difference between the first and second signals, said arrangement comprising:
   a signal generator for generating a cyclic essentially trapezoidal comparison signal having the same frequency as the prescribed PWM frequency, the shape of said trapezoidal signal dependent on one of the first or second signals, and
   a comparator for comparing the non-dependent signal of the first and second signals with the cyclic trapezoidal comparison signal and for providing the PWM signal at the output of the comparator.

2. A circuit arrangement as claimed in claim 1, wherein the signal generator generates the comparison signal with a constant amplitude independent of one of the first and second signals.

3. A circuit arrangement as claimed in claim 1, wherein the signal generator generates the comparison signal with an edge gradient independent of one signal of the first and second signals and a ratio of maximum signal duration to minimum signal duration varies as a function of one of the first and second signals.

4. A circuit arrangement as claimed in claim 1, wherein the signal generator is formed from a square wave signal generator with a downstream RC filter.

5. A control loop comprising a circuit arrangement comprising:
   a prescribed PWM frequency for a PWM signal, said PWM frequency from first and second signals input into the circuit arrangement, the PWM signal having a duty ratio varying with a difference between the first and second signals, said variance being essentially linearly with the difference,
   a signal generator for generating a cyclic comparison signal, said cyclic comparison signal being essentially a trapezoidal signal having the same frequency as the PWM frequency, and the shape of said cyclic comparison signal dependent on one of the first and second signals, and
   a comparator for comparing the other non-dependent signal of the first and second signals with the comparison signal and for providing a PWM signal at the output of the comparator,
   wherein the PWM signal produced by the circuit arrangement is a manipulated variable from a control loop formed from the first and second signals used as the control loop's reference variable and controlled variable.

6. A control loop as claimed in claim 5, wherein the signal generator generates the comparison signal with a constant amplitude independent of one of the first and second signals.

7. A control loop as claimed in claim 5, wherein the signal generator generates the comparison signal with an edge gradient independent of one of the first and second signals having a constant edge gradient, and a ratio of maximum signal duration to minimum signal duration varying a function of one of the first and second signals.

8. A control loop as claimed in claim 5, wherein the signal generator is formed from a square wave signal generator with a downstream RC filter.

9. A method for producing a PWM signal having a prescribed PWM frequency from first and second signals, wherein the PWM signal has a duty ratio varying essentially linearly with a difference between the first and second signals, said method comprising:
   producing a cyclic comparison signal, said cyclic comparison signal being an essentially trapezoidal signal having the same frequency as the prescribed PWM frequency and whose shape is dependent on one of the first and second signals, and
   comparing the other non-dependent signal of the first and second signals with the comparison signal to provide the PWM signal as the result of the comparison.

10. A method as claimed in claim 9, wherein the step of producing the comparison signal with an amplitude independent of one of the first and second signals, produces a comparison signal with a constant amplitude.

11. A method as claimed in claim 9, wherein the step of producing the comparison signal produces a signal with a constant edge gradient independent of one of the first and second signals, and a ratio of maximum signal duration to minimum signal duration varies as a function of one of the first and second signals.

12. A method for producing a manipulated variable from a control loop from the signals used as the control loop's reference variable and controlled variable, said method comprising:
   producing a PWM signal having a prescribed PWM frequency from first and second signals, the PWM signal having a duty ratio varying essentially linearly with a difference between the first and second signals,
   producing a cyclic essentially trapezoidal comparison signal having the same frequency as the prescribed PWM frequency and whose shape is dependent on one of the first and second signals, and
   comparing the other non-dependent signal of the first and second signals with the cyclic comparison signal in order to provide the PWM signal.

13. A method as claimed in claim 12, wherein the step of producing the comparison signal with an amplitude independent of one signal produces a comparison signal of constant amplitude.

14. A method as claimed in claim 12, wherein the step of producing the comparison signal produces a comparison signal having a constant edge gradient independent of one of the first and second signals, and a ratio of maximum signal duration to minimum signal duration varies as a function of one of the first and second signals.

* * * * *